(12) United States Patent
Sethuram et al.

(10) Patent No.: US 6,409,851 B1
(45) Date of Patent: Jun. 25, 2002

(54) MICROWAVE PLASMA CHEMICAL SYNTHESIS OF ULTRAFINE POWDERS

(75) Inventors: Krupashankara M. Sethuram, Falls Church; Raja Kalyanaraman, Fairfax, both of VA (US)

(73) Assignee: Materials Modifciation, Inc., Fairfax, VA (US)

( * ) Notice: Subject to any disclaimer, the term of this patent is extended or adjusted under 35 U.S.C. 154(b) by 0 days.

(21) Appl. No.: 09/262,848

(22) Filed: Mar. 5, 1999

Related U.S. Application Data

(63) Continuation of application No. PCT/US97/20917, filed on Nov. 4, 1997.
(60) Provisional application No. 60/030,188, filed on Nov. 4, 1996.

(51) Int. Cl.$^7$ ...................... C23C 16/511; C23C 16/513
(52) U.S. Cl. .............................. 148/565; 118/723 MW; 219/121.43; 219/121.59
(58) Field of Search ...................... 148/565; 219/121.43, 219/121.59; 423/289; 118/723 MW

(56) References Cited

U.S. PATENT DOCUMENTS

| | | | |
|---|---|---|---|
| 4,022,872 A | * 5/1977 | Carson et al. | 423/297 |
| 4,353,885 A | 10/1982 | Hoekje | 423/289 |
| 4,423,303 A | 12/1983 | Hirose et al. | 219/121.43 |
| 4,924,061 A | 5/1990 | Labat et al. | 219/121.52 |
| 5,384,306 A | 1/1995 | König et al. | 501/152 |
| 5,389,585 A | 2/1995 | König et al. | 501/87 |
| 5,403,375 A | 4/1995 | König et al. | 75/255 |
| 5,407,458 A | 4/1995 | König et al. | 75/255 |
| 5,734,143 A | * 3/1998 | Kawase et al. | 219/121.43 |

* cited by examiner

*Primary Examiner*—George Wyszomierski
(74) *Attorney, Agent, or Firm*—Dinesh Agarwal, P.C.

(57) ABSTRACT

The present invention relates to the production of ultrafine powders using a microwave plasma apparatus and chemical synthesis technique. Microwaves generated by a magnetron (1) are passed through waveguides (2) before they arrive at the head of a plasmatron (3). These high energy microwaves ionize a plasma gas, thus releasing large amounts of energy. The energy thus released is utilized to initiate and sustain chemical reactions between the desired elements being pumped in a spiral pattern into the plasmatron (3). The reaction products are quenched rapidly in a reactor column (4) into ultrafine powders.

16 Claims, 3 Drawing Sheets

MICROWAVE PLASMA CHEMICAL SYNTHESIS OF ULTRAFINE POWDERS

This application is a Continuing Application of PCT International Application No. PCT/US97/20917, filed Nov. 04, 1997, the contents of which are incorporated herein by reference, which claim priority to U.S. Provisional Application No. 60/030,188, filed Nov. 4, 1996.

BACKGROUND OF THE INVENTION

1. Field of the Invention

This invention relates to the field of microwave synthesis of materials, particularly, ultrafine powders having an average particle size <500 nm.

2. Description of the Related Art

Ultrafine metallic and ceramic powders have unique properties, and have the potential to contribute to significant advances in the field of electronics, solid lubricants, capacitors, batteries, sensors, thermal management substrates, and additives for the cosmetic and pharmaceutical industries. Ultrafine powders also find applications in optical coatings, slurries used for polishing, and in magnetic storage devices. Parts produced out of ultrafine particles/powders demonstrate improved mechanical, optical, and thermal properties. Conventionally, ultrafine powders have been produced by a variety of techniques including mechanical milling, flame pyrolysis, sol-gel, laser ablation, vapor deposition, and evaporation-condensation techniques.

Low power (1–2.5 kW) microwave generated plasmas have been used in many deposition, etching, and substrate processing operations. Low power microwave systems operate at plasma temperatures of less than 700° C., deposition and etching chamber are traditionally made out of brass and bronze or even copper, with quartz tube lining in some cases. These chambers or applicators can withstand 700° C. without much cooling requirements.

The application of microwaves to synthesize metallic and ceramic powders offers unique benefits, especially in producing particles of submicron size with controlled compositions and phases.

SUMMARY OF THE INVENTION

The present invention includes an apparatus and method for producing materials, preferably ultrafine powders, using microwave plasma chemical synthesis. The principle components of a microwave machine in accordance with the invention are: (1) a microwave generator, such as a magnetron, and (2) a microwave applicator. A magnetron produces microwaves by the interaction of electrons traveling in electric and magnetic fields (often referred to as "crossed fields"). This interaction coupled with high DC voltage between the cathode and the anode results in microwaves. Microwaves thus generated are then passed through waveguides before they arrive at the head of the applicator.

Microwave applicators are devices that are designed to heat a material by exposing it to a microwave field in a controlled environment. In the present invention, the applicator is referred to as "plasmatron," wherein the high energy microwave electrons ionize and dissociate the injected gas thus releasing large amounts of energy. The energy thus released is utilized to initiate a chemical reaction between the desired reactants. The interaction between the chemical species results in ultrafine powders with the desired chemical and physical characteristics. Due to rapid quenching that takes place in the reactor column the powder sizes are very fine. By controlling the diameter and length of the column, it is therefore possible to control the particle size. This apparatus can produce ultrafine powders of pure metals, such as iron, cobalt, nickel, tungsten, and rhenium; metal oxides, such as iron oxide; metal nitrides, such as titanium nitride; metal carbides; and many other ceramics, such as aluminum nitride, titanium dioxide, and aluminum dioxide. The apparatus also enables the continuous production of ultrafine particles/powders of pure metals, metal oxides, metal carbides, and metal nitrides, particularly tungsten, molybdenum, iron, cobalt, nickel, aluminum, titanium dioxide, and aluminum nitride, in contrast to the batch processes of the prior art.

Additional features and advantages of the invention will be set forth in the description which follows, and in part will be apparent from the description, or may be learned by practice of the invention. The objectives and other advantages of the invention will be realized and attained by the process and apparatus, particularly pointed out in the written description and claims hereof, as well as the appended drawings.

To achieve these and other advantages, and in accordance with the purpose of the invention as embodied and broadly described, the invention includes an apparatus for the microwave synthesis of materials. The apparatus includes a microwave generator, waveguides through which microwaves generated by the microwave generator passes into a plasma zone in which a plasma heats the reactants to form reaction products, a plasma gas inlet offset at an angle so that plasma gas passing through the inlet enters the plasma zone in a spiral-shaped pattern, and a reaction products collector downstream from the plasma zone for collecting the reaction products.

In another aspect, the invention includes an apparatus for the microwave synthesis of materials. The apparatus includes a microwave generator, waveguides through which microwaves generated by the microwave generator passes into a plasma zone in which a plasma heats reactants to form reaction products, a microwave damper at a side of the plasma zone away from the waveguide for damping microwaves that have passed through the plasma zone to thereby reduce the power of a reflected microwave by at least 60%, and a reaction products collector downstream from the plasma zone for collecting the reaction products.

In yet another aspect, the invention includes a method for the microwave synthesis of materials. The method includes introducing a plasma gas into a microwave applicator, introducing at least one reactant into the microwave applicator, generating a microwave in a microwave generator, directing the microwave into the microwave applicator containing the plasma gas to create a heated plasma in a plasma zone, absorbing the microwave to reduce the microwave reflection off of a surface of the microwave applicator by at least 60%, and causing a reaction in the plasma zone thereby converting at least one reactant into a reaction product.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one/several embodiment(s) of the invention and, together with the description, serve to explain the principles of the invention.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention. In the drawings.

DETAILED DESCRIPTION OF THE PREFERRED EMBODIMENTS

Figure 1:
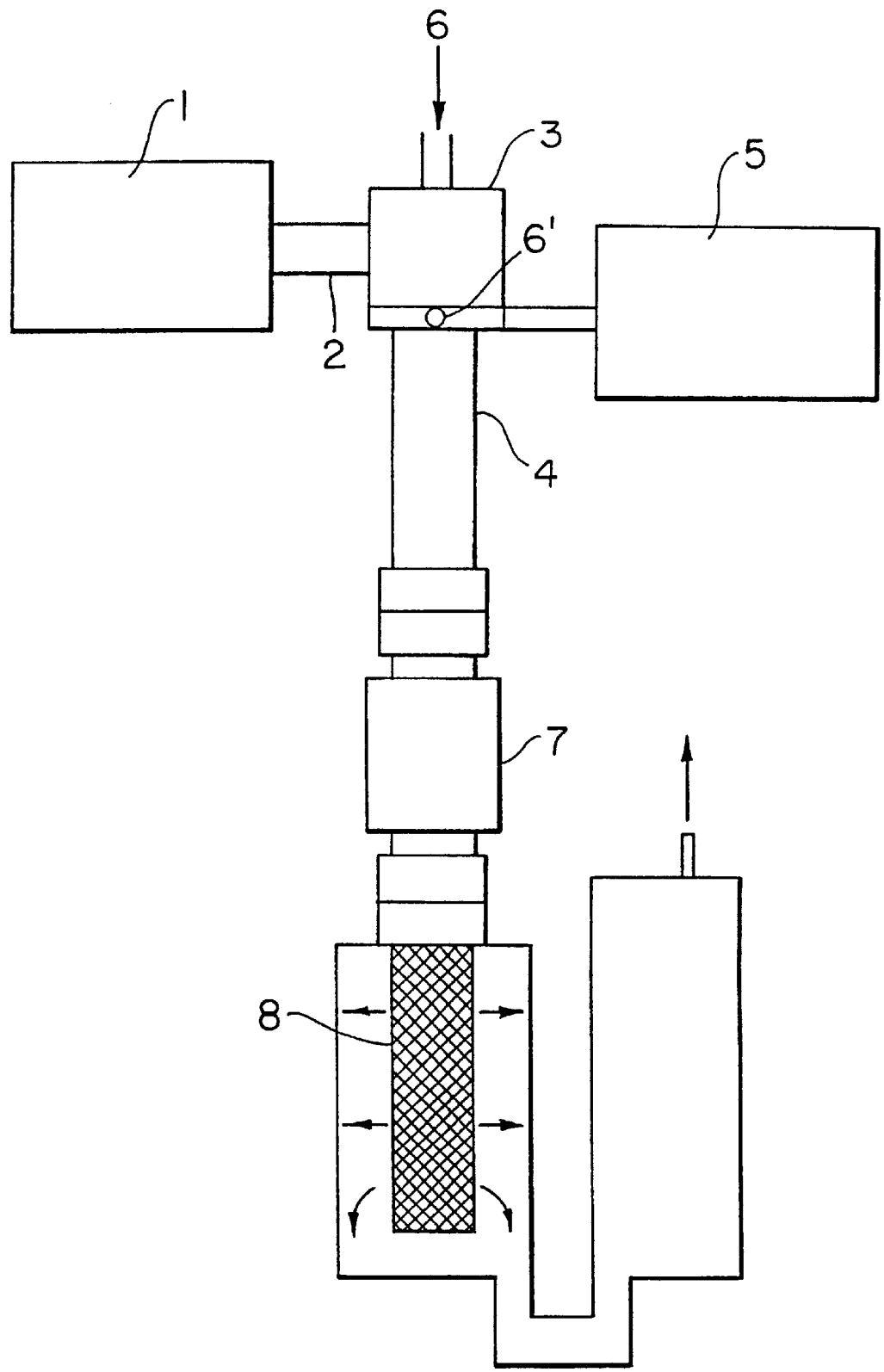
FIG. 1 is a schematic of a microwave plasma chemical synthesis apparatus according to an embodiment of the invention.

The device that generates the microwave is illustrated in FIG. 1 and is called a "magnetron." The primary factors that determine the choice of a particular magnetron are the power and frequency of the microwave required for initiating and sustaining the plasma chemical reaction. For example, continuously variable magnetron input power between 1–6 kW is generated at a frequency of 2425–2475 MHZ. The power of the microwave dictates the production rate of the metallic and ceramic powders. The microwave generated by the magnetron can operate in either transverse electromagnetic (TEM), transverse electric (TE), or transverse magnetic (TM) modes. The TE or TM wave is generated in a waveguide, which is typically a hollow conducting pipe having either a rectangular or circular cross-section.

The present invention preferably uses a rectangular waveguide and the microwaves preferably operate in the TE mode (TE01) where 0 or 1 are the field distributions for this mode of propagation, which are generated by the rectangular waveguides.

The microwaves thus propagated are directed towards the applicator, referred to as the "plasmatron," where they ionize the plasma-forming gas, resulting in a "plasma" zone.

A microwave damper, preferably a water-cooled glass tube, a water-cooled rectangular aluminum tube, or other water filled damping system, is positioned after the plasmatron and opposite to the rectangular waveguide. This damper absorbs microwaves to prevent their reflection back into the magnetron. Reflected microwaves can propagate back through the plasma zone and into the magnetron where they cancel out incident microwaves. This condition drastically reduces the efficiency of the deposition apparatus and inhibits the plasma temperature that can be attained. For example, if the incident, or forward power of the microwave is 6 kW, and the reflected power is 4 kW, the effective power, that is, the power of the microwave that creates the plasma is only 2 kW. Prior art devices either completely lack any capability of eliminating reflected microwaves or use a metallic plate which must continually be repositioned due to the dynamic nature and unpredictability of the plasma contained within the plasma zone.

If the metallic plate is not precisely placed, the reflected waves become out of phase with the incident waves, canceling them out. Thus, positioning the plate becomes an inevitable step in preparing the microwave system for production. Moreover, the operator's freedom of dynamically modifying the parameters of the system is severely restricted by the need to continually adjust the plates to find the optimal position within the apparatus.

In contrast, the damper of the present apparatus diminishes the strength of the reflected wave, thereby reducing the adverse effect of the reflected wave regardless of its phase. This gives the operator a faster equipment preparation time, and provides him the freedom of continually adjusting the operating characteristics of the apparatus. The microwave damper of this invention reduces the power of the reflected microwave by 60–100%, preferably by an amount greater than 80–85%.

Various types of gases can be used depending on the desired powder and powder characteristics. Candidate plasma gases include hydrogen, oxygen, helium, argon, nitrogen, methane, or a combination of the above. Ionization of the gas results in the release of large amounts of energy, which will instantly vaporize the chemicals being injected into the plasmatron thereby initiating the desired chemical reaction. The temperature in the plasmatron is typically between 500–1100° C. The plasma-forming gas carries the reaction products into the reactor column where they are rapidly quenched using, for example, a double-walled, water-cooled stainless steel column with quartz lining. The gas may be introduced through an axial, radial, or angled inlet. Preferably, the plasma gas is introduced into the plasmatron using a spiral gas flow pattern which confines the plasma to the central region of the plasmatron thereby preventing it from damaging the plasmatron walls or reaction column material. Specifically, the spiral pattern creates a cyclone-like pattern with a central low pressure section which controls the dimensions of the plasma. Therefore, higher energies and higher temperatures may be used to produce smaller, better quality, and more uniform powders than otherwise would be attainable with a lower power system. The spiral gas flow pattern may be produced by introducing the plasma gas into the reaction zone at an oblique angle. One manner of doing so is by offsetting the inlet port at an angle between 0–90°, preferably angled at 15°. The gas may be introduced through a single inlet port or through multiple (e.g., four) inlet ports circumferentially arranged about the reaction zone. It is also possible to introduce the reactants obliquely into the reaction zone either before or after being entrained in the plasma gas.

The quenching rate, reactor column diameter, and the length influence the powder size and distribution. The quenching rate depends on the cooling water temperature, which may vary from 20° C. to –5° C.; the lower the temperature, the finer the particle size. The reactor column diameter preferably varies from 2–6" depending on the particle size distribution required. The reaction column length preferably varies from 8–12" and is a function of the temperature drop desired before the ultrafine particles enter the filter bag. The filter bag is designed to withstand temperatures in the range of 300–600° C. The construction of the rest of the apparatus and the raw material feeding device varies with the desired end product as is evident from the examples.

A particularly useful advantage of this invention is the ability to generate ultrafine powders with a powder particle size smaller than 10–500 nm, preferably smaller than 100 nm but having a substantially uniform particle size distribution. A relatively narrow particle size distribution is advantageous because of the influence the particle size has on powder densification characteristics and the final material properties. A uniform size distribution that may be maintained and controlled enables the end product manufacturer to better predict and control the properties of the final product.

Existing processes result in relatively wide and unpredictable particle size distributions. In some cases, the distribution may be bimodal or asymmetrical.

This invention, however, enables a particle size distribution 50 nm or less (as measured, for example, by a Laser Scattering Particle Size Analyzer). Moreover, the parameters can be varied to produce varying size distributions, e.g, from 50 nm or less to 100 nm or more, across the entire range of average particle sizes (e.g., from less than 10 nm to greater than 1 micron). The distribution may also be controlled to be more symmetrical about the mean than prior art processes, and can approximate a normal distribution if so desired.

FIG. 1 is a schematic of a device according to the invention. A microwave generator 1, which may include a magnetron is used to generate microwaves. A continuously variable input power of greater than 1 kW, preferably greater than 3–6 kW, and more preferably greater than 5–6 kW, may be generated at a frequency of 2425–2475 MHZ. The microwaves thus generated are carried through rectangular waveguides 2 to the plasmatron 3.

The plasmatron is a microwave applicator wherein the microwaves ionize the gas which can be injected both radially and axially through an injector port 6. The plasmatron also includes a feed port for attaching a raw material dosing device 5. The chemical interaction of the reactants in the form of starting powders or vapors takes place in the plasmatron. The powders formed are instantaneously quenched in a reaction column 4. The rapid dissociation of the reactants followed by quenching results in the production of the ultrafine powders. The reaction column preferably used in the invention is longer than conventional reaction columns thereby enabling the user to produce ultrafine particles not capable of being produced in the prior art devices. Specifically, the longer reaction column in combination with higher temperatures, gives the reaction an opportunity to continue as a residual reaction which may cause the reactants and products to melt, evaporate, and recondense thereby enabling a size heretofore unattainable. After formation, the powders passing through the reaction column are still hot. The heat associated with the ultrafine powders is removed using a heat exchanger 7. The powders pass through the heat exchanger into a powder collector 8. The powder collector is preferably a stainless steel container including a filter bag which retains the powders while the gases are removed through an exhaust located downstream from the powder collector.

Figure 2A:
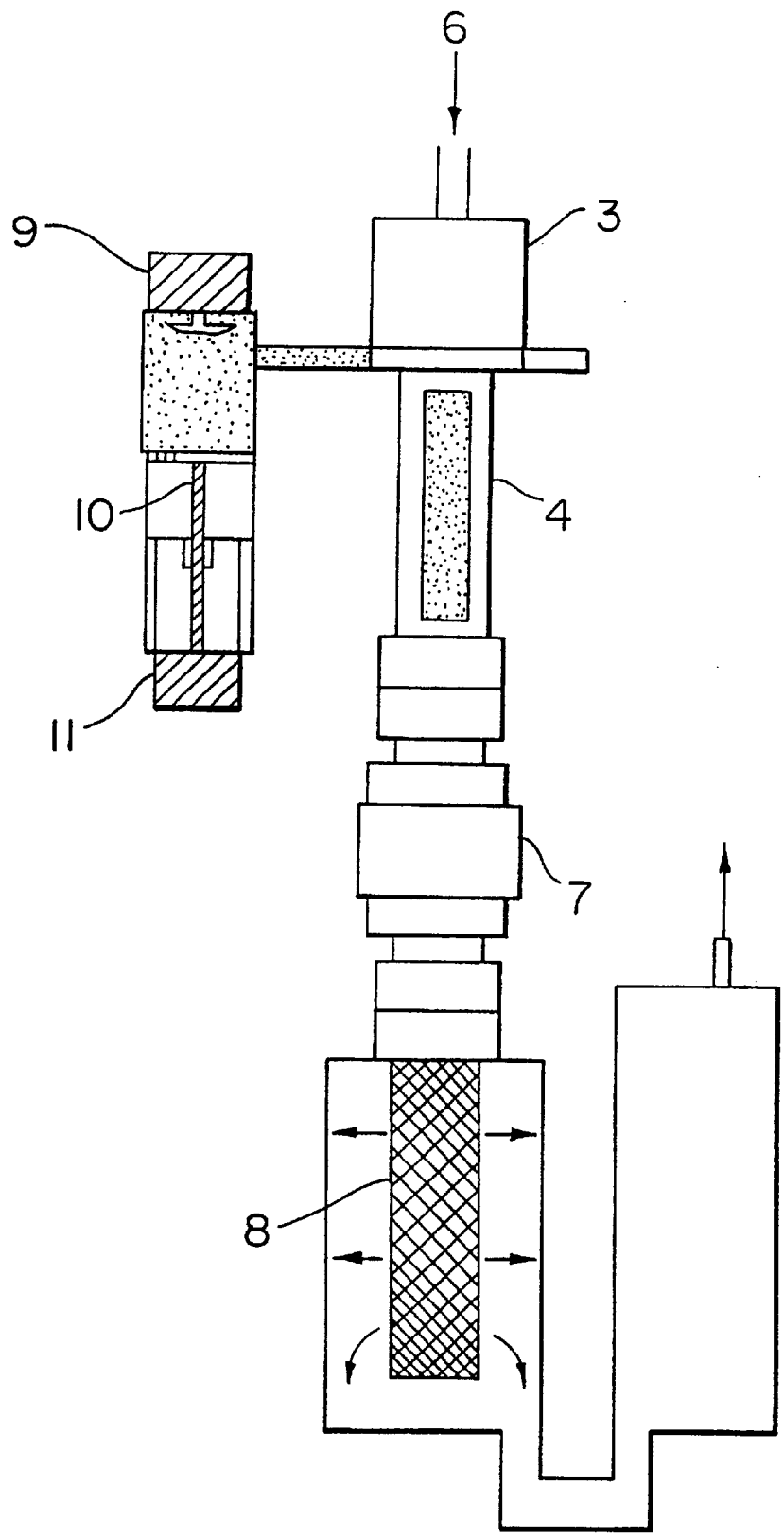
FIG. 2(a) is a schematic of a powder feeding device which may be used with the invention.

FIG. 2(a) is a schematic of a powder feeding device which may be connected to the feed port located in the plasmatron. This device preferably includes a motor located near the powder zone 9, which rotates a blade to continuously create an aerosol, which is also a driving force for the powders to be fed into the injection port. The powders may be carried to the powder zone through a piston support 10 which is driven by a motor 11.

Figure 2B:
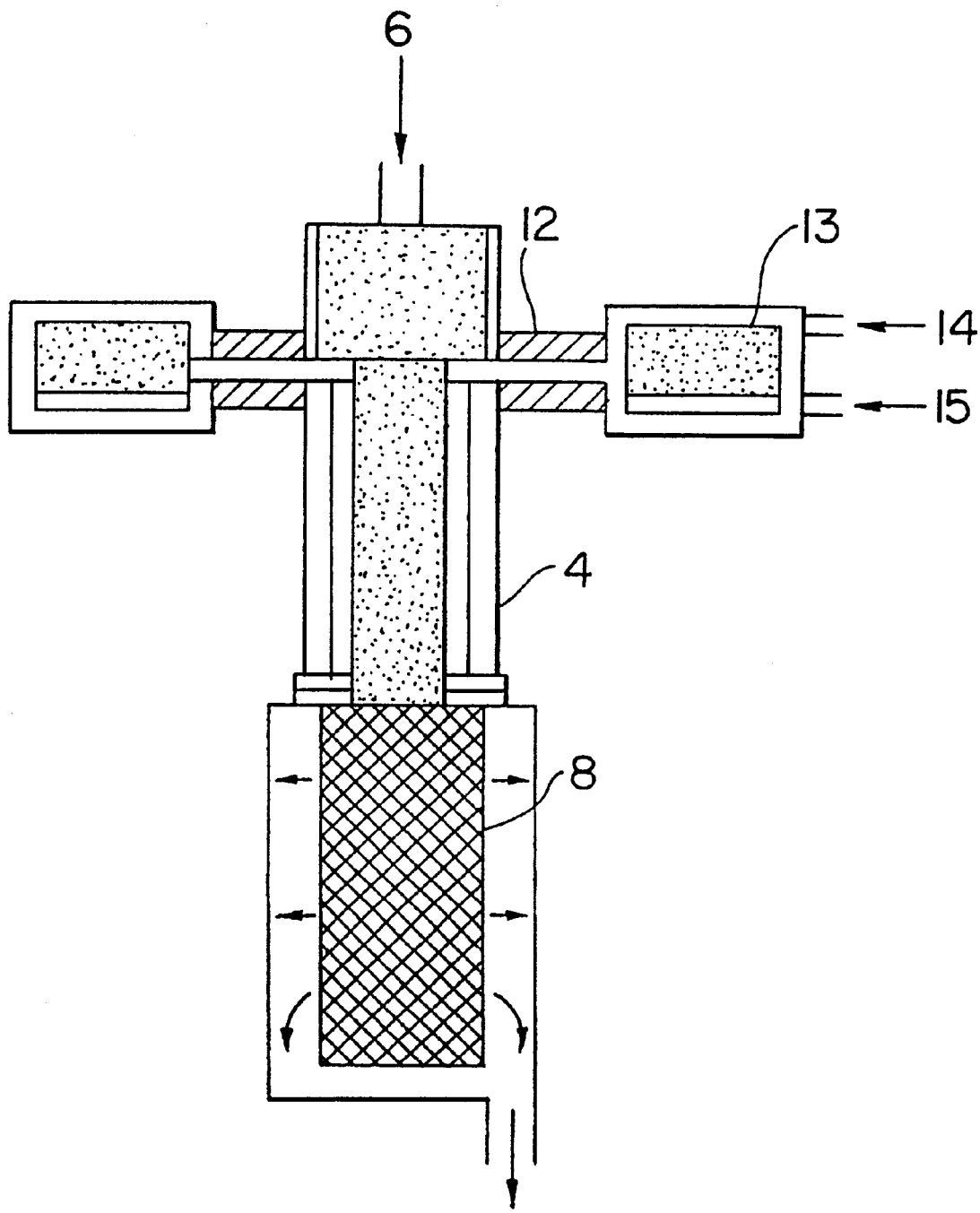
FIG. 2(b) is a schematic of a chemical vapor feeding device which may be used in another embodiment of the invention.

FIG. 2(b) is a schematic of a chemical vapor feeding device which may be used with the invention. Liquid precursors such as metal carbonyls are injected into the plasmatron from, for example, a double-walled stainless steel container 13, which may be continuously heated by water pipes (14, 15). Vapors of the liquid precursors are then fed into the plasmatron 3 through electrically heated hose 12 in order to prevent any condensation. The ultrafine powders formed are quenched in the reactor column 4, and subsequently collected in the stainless steel container which houses a filter bag to retain the fine powders and allow the gases to pass through the exhaust.

EXAMPLE 1

Ultrafine powders of pure tungsten powders were produced using a tungsten carbonyl, specifically tungsten hexacarbonyl, as the raw material and nitrogen as the carrier gas and also as the plasma gas. The plasma gas flow rate was 0.002–0.0022 $m^3$/min and that of the carrier gas was 0.0003–0.0004 $m^3$/min. The plasma temperature was 600–650° C., the powder feed rate was 25–30 gm/hr and the quenching water flow rate was 2.4–2.5 liter/min at 20° C. The reactor column diameter was 48 mm and its length was 10". The microwave forward power was 4.5 kW, the reflected power was 1.2 kW, and the operating frequency was 2400 MHZ. The particles so produced had a particle size of less than 50 nm.

EXAMPLE 2

Ultrafine powders of molybdenum were produced using molybdenum carbonyl, specifically molybdenum hexacarbonyl, as the raw material and nitrogen as the carrier gas and also the plasma gas. The plasma gas flow rate was 0.0025–0.003 $m^3$/min and that of the carrier gas was 0.0004–0.0006 $m^3$/min. The plasma temperature was 1000–1200° C., the powder feed rate was 20–25 gm/hr, and the quenching water flow rate was 1.5–1.8 liter/min at 20° C. The reactor column diameter was 48 mm and its length was 10". The microwave forward power was 3.5 kW, the reflected power was 0.6 kW, and the operating frequency was 2400 MHZ. The produced powders had a particle size less than 50 nm.

EXAMPLE 3

Ultrafine powders of aluminum nitride (AlN) with a particle size less than 60 nm, were produced using aluminum powder and ammonia as the carrier gas and a combination of argon (30%) and nitrogen (70%) as the plasma gas. The plasma gas flow rate was 0.0035–0.004 $m^3$/min and that of the carrier gas was 0.0012–0.0015 $m^3$/min. The plasma temperature was 1100–1200° C., the powder feed rate was 25–30 gm/hr, and the quenching water flow rate was 2.0–2.2 liter/min at 20° C. The reactor column diameter was 48 mm and its length was 10". The microwave forward power was 3.5 kW, the reflected power was 0.7 kW, and the operating frequency was 2450 MHZ.

EXAMPLE 4

Ultrafine powders of cobalt with a particle size less than 40 nm were produced when cobalt carbonyl, specifically cobalt octacarbonyl, were fed into the plasmatron with argon as the plasma gas. The plasma gas flow rate was 0.0025–0.0026 $m^3$/min and that of the carrier gas was 0.0003–0.0005 $m^3$/min. The plasma temperature was 900–950° C., the powder feed rate was 50–60 gm/hr, and the quenching water flow rate was 1.8–2.0 liter/min at 20° C. The reactor column diameter was 48 mm and its length was 10". The microwave forward power was 3.5 kW, the reflected power was 0.9 kW, and the operating frequency was 2400 MHZ.

EXAMPLE 5

Ultrafine powders of rhenium were produced with an average particle size of 70 nm using the rhenium carbonyl, specifically rhenium hexacarbonyl as the raw material precursor. Argon was used as the plasma gas. The plasma gas flow rate was 0.002–0.0022 $m^3$/min and that of the carrier gas was 0.0003–0.0004 $m^3$/min. The plasma temperature was 1200° C., the powder feed rate was 25–30 gm/hr, and the quenching water flow rate was 2.4–2.5 liter/min at 20° C. The reactor column diameter was 48 mm and its length was 10". The microwave forward power was 4.5 kW, the reflected power was 0.6 kW, and the operating frequency was 2450 MHZ.

EXAMPLE 6

Ultrafine powders of iron with a particle size less than 20 nm were produced when vapors of iron pentacarbonyl were fed into the plasmatron with argon as the plasma gas. The plasma gas flow rate was 0.003–0.0034 $m^3$/min and that of the carrier gas was 0.0003–0.0004 $m^3$/min. The plasma temperature was 900–950° C., the powder feed rate was 50–60 gm/hr, and the quenching water flow rate was 2.0–2.5 liter/min at 20° C. The reactor column diameter was 48 mm and its length was 10". The microwave forward power was 4 kW, the reflected power was 0.7 kW, and the operating frequency was 2450 MHZ.

EXAMPLE 7

Ultrafine powders of titanium dioxide with a particle size less than 40 nm were produced when vapors of titanium tetrachloride dissolved in water were injected into an oxygen plasma. The plasma gas flow rate was 0.002–0.0022 $m^3$/min and that of the carrier gas was 0.0003–0.0004 $m^3$/min. The plasma temperature was 600–650° C., the powder feed rate was 25–30 gm/hr, and the quenching water flow rate was 2.4–2.5 liter/min at 20° C. The reactor column diameter was 48 mm and its length was 10". The microwave forward power was 4.5 kW, the reflected power was 1.2 kW, and the operating frequency was 2400 MHZ.

EXAMPLE 8

Ultrafine powders of nickel with a particle size less than 40 nm were produced when vapors of nickel pentacarbonyl were fed into the plasmatron with argon as the plasma gas. The plasma gas flow rate was 0.002–0.0022 $m^3$/min and that of the carrier gas was 0.0003–0.0004 $m^3$/min. The plasma temperature was 600–650° C., the powder feed rate was 25–30 gm/hr, and the quenching water flow rate was 2.4–2.5 liter/min at 20° C. The reactor column diameter was 48 mm and its length was 10". The microwave forward power was 4.5 kW, the reflected power was 1.2 kW, and the operating frequency was 2400 MHZ.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for the microwave synthesis of materials, comprising:

a microwave generator;

a waveguide through which a microwave generated by said microwave generator passes into a plasma zone positioned such that a plasma is capable of heating reactants to form reaction products;

a plasma gas inlet offset at an angle so that plasma gas passing through the inlet enters the plasma zone in a spiral-shaped pattern; and a reaction products collector downstream from said plasma zone for collecting the reaction products.

2. The apparatus of claim 1, wherein said plasma zone comprises a microwave damper at a side of the plasma zone away from the waveguide for damping microwaves that have passed through the plasma zone to thereby reduce the power of a reflected microwave by at least 60%.

3. The apparatus of claim 2, wherein the microwave damper is a water cooled glass tube.

4. The apparatus of claim 2, wherein the microwave damper is a water cooled metal tube.

5. The apparatus of claim 2, wherein the microwave damper is a water cooled rectangular tube.

6. The apparatus of claim 1, comprising a column located between the plasma zone and the reaction products collector for cooling the reaction products leaving the plasma zone.

7. The apparatus of claim 6, wherein the column is 8–12 inches long.

8. The apparatus of claim 1, comprising a plurality of plasma gas inlets.

9. The apparatus of claim 1, wherein the plasma gas inlet is offset at an angle between 5–30°.

10. The apparatus of claim 1, wherein the plasma gas inlet is offset at 15°.

11. An apparatus for the microwave synthesis of materials, comprising:

a microwave generator;

a waveguide through which a microwave generated by said microwave generator passes into a plasma zone positioned such that a plasma is capable of heating reactants to form reaction products;

a microwave damper at a side of the plasma zone away from the waveguide for damping microwaves that have passed through the plasma zone to thereby reduce the power of a reflected microwave by at least 60%; and a reaction products collector downstream from said plasma zone for collecting the reaction products.

12. A method for the microwave synthesis of materials, said method comprising:

introducing a plasma gas into a microwave applicator;

introducing at least one reactant into the microwave applicator;

generating a microwave in a microwave generator;

directing the microwave into the microwave applicator containing the plasma gas to create a heated plasma in a plasma zone;

absorbing the microwave to reduce the microwave reflection off of a surface of the microwave applicator by at least 60%; and causing a reaction in the plasma zone thereby converting the at least one reactant into a reaction product.

13. The method of claim 12, further comprising:

introducing the plasma gas into the microwave applicator in a spiral shaped pattern.

14. The method of claim 12, further comprising:

introducing the plasma gas into the microwave applicator at an oblique angle to thereby produce a spiral shaped pattern.

15. The method of claim 12, wherein at least one reactant is a powder material.

16. The method of claim 13, wherein at least one reactant is a reactant chemical vapor.

* * * * *